United States Patent
You et al.

(10) Patent No.: US 9,159,949 B2
(45) Date of Patent: Oct. 13, 2015

(54) ORGANIC ELECTROLUMINESCENT DISPLAY DEVICE AND METHOD OF FABRICATING THE SAME

(75) Inventors: Chun Gi You, Yongin-si (KR); Joon Hoo Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 94 days.

(21) Appl. No.: 13/529,952

(22) Filed: Jun. 21, 2012

(65) Prior Publication Data

US 2013/0105821 A1    May 2, 2013

(30) Foreign Application Priority Data

Oct. 28, 2011    (KR) ........................ 10-2011-0111477

(51) Int. Cl.
*H01L 51/52*    (2006.01)
*H01L 27/32*    (2006.01)
*H01L 21/768*    (2006.01)
*H01L 21/48*    (2006.01)

(52) U.S. Cl.
CPC ........ *H01L 51/5225* (2013.01); *H01L 51/5231* (2013.01); *H01L 21/485* (2013.01); *H01L 21/76868* (2013.01); *H01L 27/3258* (2013.01); *H01L 2251/568* (2013.01)

(58) Field of Classification Search
CPC ..................... H01L 2251/568; H01L 27/3258; H01L 21/485; H01L 21/76868; H01L 21/76894
See application file for complete search history.

(56) References Cited

U.S. PATENT DOCUMENTS

| | | | | |
|---|---|---|---|---|
| 6,376,333 | B1 * | 4/2002 | Yamazaki et al. | 438/458 |
| 2004/0096993 | A1 * | 5/2004 | Kuo | 438/15 |
| 2007/0241665 | A1 * | 10/2007 | Sakanoue et al. | 313/503 |
| 2008/0233826 | A1 * | 9/2008 | Matsuda | 445/2 |
| 2010/0164375 | A1 | 7/2010 | Kajiyama et al. | |
| 2010/0200869 | A1 * | 8/2010 | Sekiya | 257/88 |
| 2010/0258833 | A1 * | 10/2010 | Okumoto et al. | 257/98 |
| 2011/0215362 | A1 * | 9/2011 | Ono et al. | 257/99 |

FOREIGN PATENT DOCUMENTS

KR    10 2005 0081308 A    8/2005
KR       10 0667089 B    1/2007

* cited by examiner

*Primary Examiner* — Su C Kim
(74) *Attorney, Agent, or Firm* — Knobbe Martens Olson & Bear LLP

(57) ABSTRACT

An organic electroluminescent display device includes a first electrode on a substrate, an organic layer including a light-emitting layer on the first electrode, a second electrode including lower and upper conductive layers sequentially stacked on the organic layer, and an insulating pattern extending into the organic layer through the lower conductive layer.

13 Claims, 5 Drawing Sheets

ORGANIC ELECTROLUMINESCENT DISPLAY DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2011-00111477, filed on Oct. 28, 2011, in the Korean Intellectual Property Office, the entire contents of which are hereby incorporated by reference.

BACKGROUND

1. Field

Embodiments of the inventive concepts relate to an organic electroluminescent display device and a method of fabricating the same.

2. Description of the Related Technology

In general, an organic electroluminescent display device may include an anode, a cathode, and an organic layer interposed between the anode and cathode. The anode may include a transparent conductive material, such as, for example, ITO, and the cathode may include a metal layer whose work function is smaller than that of the anode. If the organic electroluminescent display device is forwardly biased, holes and electrons are injected into the organic layer through the anode and the cathode, respectively, and then, are combined with each other in the organic layer to generate excitons causing an electroluminescence phenomenone.

However, in a process of fabricating the organic electroluminescent display device, an extraneous matter, such as fine dusts, may be included in the organic layer between the anode and the cathode. The extraneous matter may result in an electric short between the anode and the cathode, and the pixel having such extraneous matter may malfunction.

SUMMARY OF CERTAIN INVENTIVE ASPECTS

Embodiments of the inventive concepts provide an organic electroluminescent display device including a pixel which may be repaired by removing an extraneous matter from an organic layer.

Other embodiments provide a method of fabricating the organic electroluminescent display device.

According to some embodiments, an organic electroluminescent display device can include a substrate, a first electrode on the substrate, an organic layer including a light-emitting layer on the first electrode, a second electrode including lower and upper conductive layers sequentially stacked on the organic layer, and an insulating pattern extending into the organic layer through the lower conductive layer.

In some embodiments, a height of the insulating pattern can be smaller than or equal to a total thickness of the organic layer and the lower conductive layer.

In some embodiments, the insulating pattern can include one of a silicon oxide layer and a silicon nitride layer.

According to other embodiments, a method of fabricating an organic electroluminescent display device can include forming a first electrode on a substrate, forming an organic layer including an light-emitting layer on the first electrode, forming a lower conductive layer on the organic layer, illuminating a laser onto the organic layer through an upper surface of the lower conductive layer to remove an extraneous matter from the organic layer and form a hole penetrating the lower conductive layer, forming an insulating pattern to fill the hole, and forming an upper conductive layer to cover the insulating pattern and the lower conductive layer.

In some embodiments, a depth of the hole can be smaller than or equal to a total thickness of the organic layer and the lower conductive layer.

BRIEF DESCRIPTION OF THE DRAWINGS

Certain embodiments will be more clearly understood from the following brief description taken in conjunction with the accompanying drawings.

FIG. 1 is a circuit diagram of an embodiment of an organic electroluminescent display device;

FIG. 2 is a plan view illustrating one of the pixels of FIG. 1;

FIG. 3 is a sectional view taken along line I-I' of FIG. 2; and

FIGS. 4 through 7 are sectional views illustrating en embodiment of a method of fabricating the organic electroluminescent display device of FIG. 3.

Figure 1:
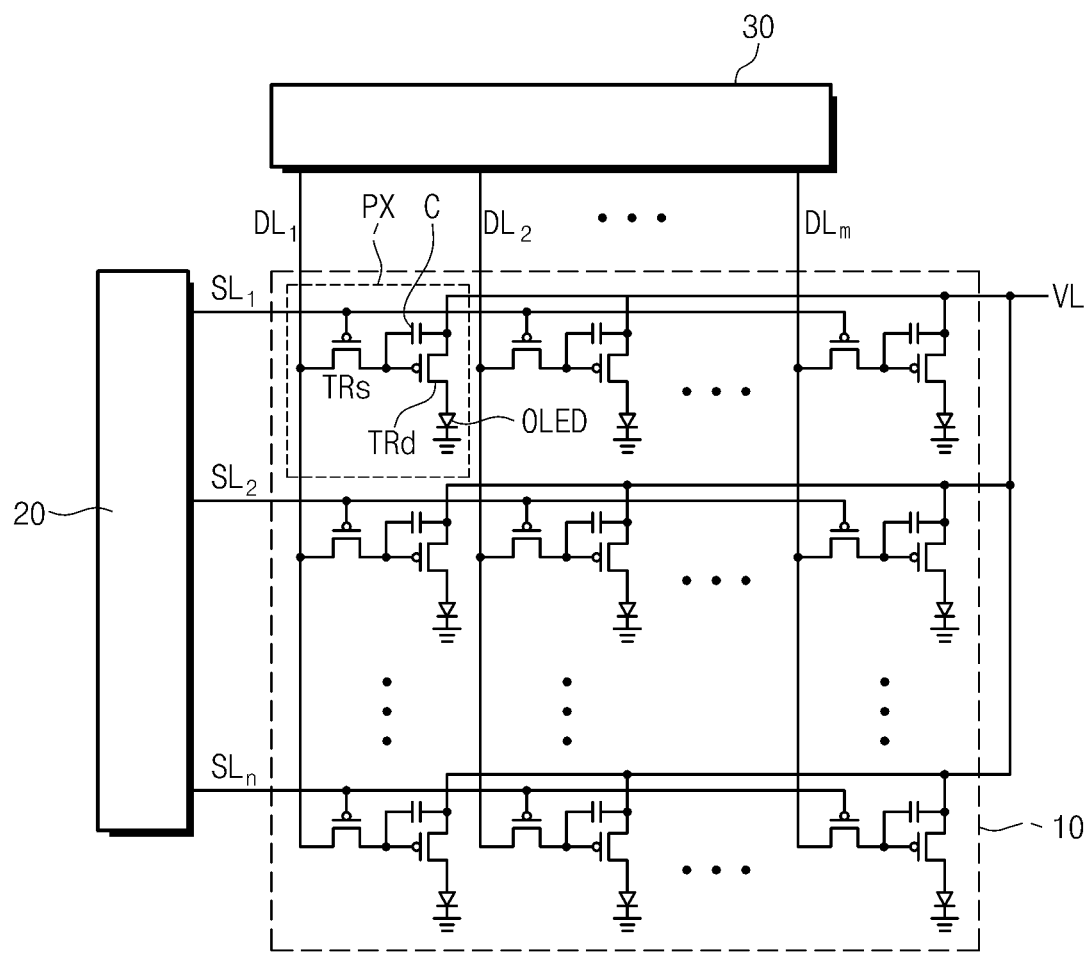
FIGS. 1 through 7 represent non-limiting embodiments as described herein.

It should be noted that these figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by the embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF CERTAIN INVENTIVE EMBODIMENTS

Certain embodiments of the inventive concepts will now be described more fully with reference to the accompanying drawings. Other embodiments may, however, be embodied in many different forms and should not be construed as being limited to the embodiments set forth herein; rather, these embodiments are provided so that this disclosure will be thorough and complete, and will fully convey the concept of certain embodiments to those of ordinary skill in the art. In the drawings, the thicknesses of layers and regions may be exaggerated for clarity. Like reference numerals in the drawings generally denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers generally indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on", etc.).

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of certain embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Certain embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art to which the embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
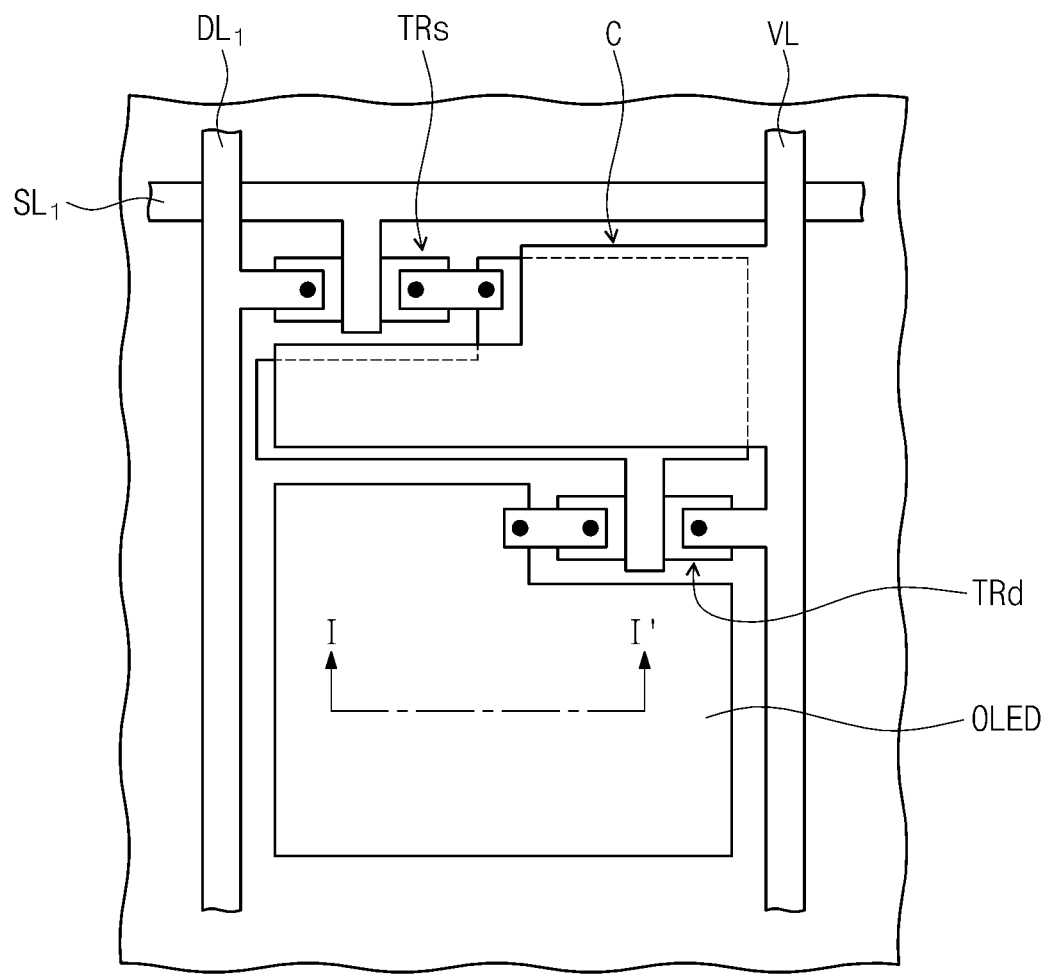

FIG. 1 is a circuit diagram of an embodiment of an organic electroluminescent display device, and FIG. 2 is a plan view illustrating one of the pixels of FIG. 1.

Referring to FIGS. 1 and 2, an organic electroluminescent display device can include a display portion 10 to display an image, a scan drive 20 and a data drive 30.

The scan drive 20 can be electrically connected to the display portion 10 via a plurality of scan lines $SL_1$, $SL_2$ and SLn. Scan signals from the scan drive 20 can be transmitted to the display portion 10 via the scan lines $SL_1$, $SL_2$ and SLn. The scan lines $SL_1$, $SL_2$ and SLn can extend along a direction.

The data drive 30 can be electrically connected to the display portion 10 via a plurality of data lines $DL_1$, $DL_2$ and DLm. Data signals from the data drive 30 can be transmitted to the display portion 10 via the data lines $DL_1$, $DL_2$ and DLm.

The data lines $DL_1$, $DL_2$ and DLm can extend to cross the scan line $SL_1$, $SL_2$ and SLn. Thus, the data lines $DL_1$, $DL_2$ and DLm and the scan lines $SL_1$, $SL_2$ and SLn can intersect with each other.

The organic electroluminescent display device can further include power lines VL configured to supply an electric power to the display portion 10.

The display portion 10 can include a plurality of pixels PX. Each of the pixels PX can be electrically connected to the corresponding one of the data lines $DL_1$, $DL_2$ and DLm, the corresponding one of the scan lines $SL_1$, $SL_2$ and SLn, and the corresponding one of the power lines VL. Each of the pixels PX can include a switching transistor TRs, a driving transistor TRd, and an organic light emitting diode OLED.

In an operation of the organic electroluminescent display device, a scan signal from the scan drive 20 and a data signal from the data drive 30 can be delivered to one of the pixels PX via the scan lines $SL_1$, $SL_2$ and SLn and the data lines $DL_1$, $DL_2$ and DLm, respectively. The switching transistor TRs of each pixel PX can control an on/off state of the driving transistor TRd in response to the scan signal and the data signal. The driving transistor TRd can be configured to supply a driving current to the organic light emitting diode OLED in response to the data signal. The organic light emitting diode OLED can be configured to generate a light using the driving current.

In some embodiments, to maintain the data signal for a predetermined duration, a capacitor C can be disposed between gate and drain electrodes of the driving transistor TRd. Due to the presence of the capacitor C, the gate electrode of the driving transistor TRd can have an electric potential corresponding to the data signal, even when the switching transistor TRs is off.

Although not depicted in detail, the organic electroluminescent display device can further include at least one thin film transistor and/or at least one capacitor, for example, to compensate a threshold voltage of the driving transistor.

Figure 3:
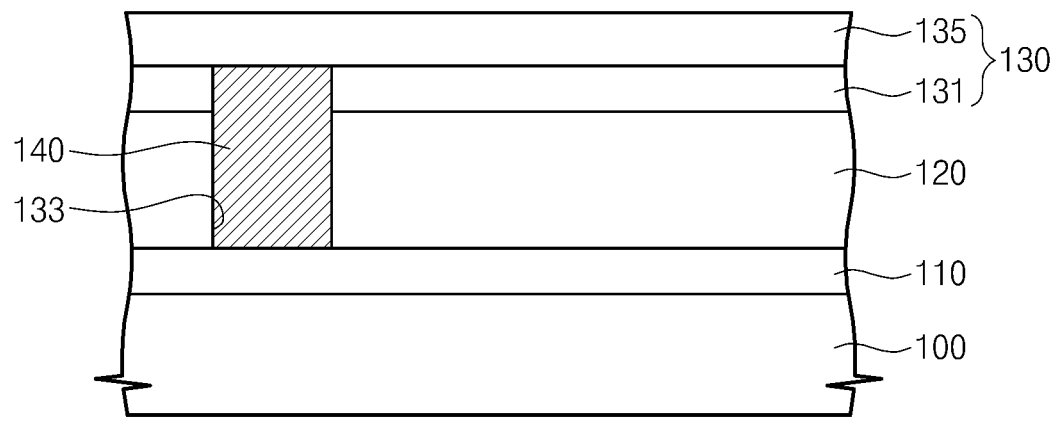

FIG. 3 is a sectional view taken along line I-I' of FIG. 2 and provided to describe an organic light emitting diode of FIG. 2.

Referring to FIG. 3, the organic light emitting diode OLED can include a first electrode 110, an organic layer 120, and a second electrode 130, which are sequentially stacked on a substrate 100. In some embodiments, one of the first and second electrodes 110 and 130 can be an anode and the other a cathode. For the sake of simplicity, the description that follows will refer to an embodiment in which the first electrode 110 is an anode and the second electrode 130 is a cathode.

The first electrode 110 can be formed of at least one of conductive layers or transparent conductive oxides. The transparent conductive oxides can include indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO). In some embodiments, the first electrode 110 can be electrically connected to the driving transistor TRd of FIG. 2 such that it can be supplied a driving current in response to the data signal.

The organic layer 120 can include at least a light-emitting layer EML and, in general, be configured to have a multi-layered structure. For example, the organic layer 120 can include a hole injection layer HIL for injecting holes, a hole transport layer HTL, the light-emitting layer EML, a hole blocking layer HBL, an electron transport layer ETL, and an electron injection layer EIL for injecting electrons. The hole transport layer HTL can be formed of a material exhibiting a good hole transporting property. In some embodiments, the material for the hole transport layer HTL can be selected to effectively suppress movements of holes, which are not used for a recombination process in the light-emitting layer EML. This enables to increase the chance of the recombination between the holes and the electrons. In the light-emitting layer EML, the injected electrons and holes can be recombined to generate a light. The hole blocking layer HBL can be formed of a material exhibiting a property of suppressing movements of holes, which are not used for a recombination process in the light-emitting layer EML. The electron transport layer (ETL) can be formed of a material exhibiting a property of effectively transporting electrons to the light-emitting layer EML.

The organic layer 120 can include a low molecular or high molecular organic material. The low molecular organic material for the organic layer 120 can include one of copper phthalocyanine (CuPc), N,N'-Di naphthalene-1-yl-N,N'-diphenyl-benzidine (NPB), and tris-8-hydroxyquinoline aluminum (Alq3). The high molecular organic material for the organic layer 120 can include one of poly-2,4-ethylene-dihydroxy thiophene (PEDOT) and polyaniline (PANI).

In the case in which the light-emitting layer EML is formed of a high molecular organic material, the light-emitting layer EML can include one of PPV, Soluble PPV's, CyanoPPV, and Polyfluorene. In addition, the light-emitting layer EML can be configured to be stack-type or tandem-type. The stack-type light-emitting layer can include sub-light-emitting layers of red, green and blue, and embodiments are not limited to a specific stacking order of the sub-light-emitting layers. In the stack-type and/or tandem-type light-emitting layer, all of the red, green and blue sub-light-emitting layers can be fluorescent light-emitting layers or at least one of them can be a phosphorescence light-emitting layer. For the tandem-type light-emitting layer, light-emitting layers, which are disposed at both sides of a charge generation layer (CGL), respectively, can be configured to emit a light of white color, of different colors from each other, or of the same color. The different colors or the same color can be monochromatic or polychromatic.

The second electrode 130 can include a plurality of conductive layers. For example, the second electrode 130 can include a lower conductive layer 131 disposed on the organic layer 120 and an upper conductive layer 135 disposed on the lower conductive layer 131. In some embodiments, the lower conductive layer 131 and the upper conductive layer 135 can be formed of materials exhibiting a reflective property and having a lower work function than the first electrode 110. For example, the lower and upper conductive layers 131 and 135 can be formed of at least one of Mo, MoW, Cr, Al, AlNd or Al alloys. In some embodiments, a thickness of the upper conductive layer 135 can be greater than that of the lower conductive layer 131.

In some embodiments, the organic light emitting diode OLED can include a hole 133 penetrating the lower conductive layer 131. A portion of the organic layer 120 can be removed by the hole 133. A depth of the hole 133 can be equal or less than a total thickness of the organic layer 120 and the lower conductive layer 131. An insulating pattern 140 can be provided in the hole 133. In other words, the insulating pattern 140 can penetrate the lower conductive layer 131 and extend into the organic layer 120. In some embodiments, the insulating pattern 140 can be formed to penetrate both the lower conductive layer 131 and the organic layer 120. In some embodiments, a height of the insulating pattern 140 can be equal or less than a total thickness of the organic layer 120 and the lower conductive layer 131.

In some embodiments, the insulating pattern 140 can include at least one of organic and/or inorganic insulating materials. For example, the insulating pattern 140 can include at least one of depositable materials (for example, silicon oxide SiOx and silicon nitride SiNx).

In some embodiments, although not depicted, at least one insulating layer (not shown) can be provided between the substrate 100 and the first electrode 110.

Hereinafter, a method of fabricating the organic electroluminescent display device will be described with reference to FIGS. 4 through 7. FIGS. 4 through 7 are sectional views illustrating an embodiment of a method of fabricating the organic electroluminescent display device of FIG. 3.

Figure 4:
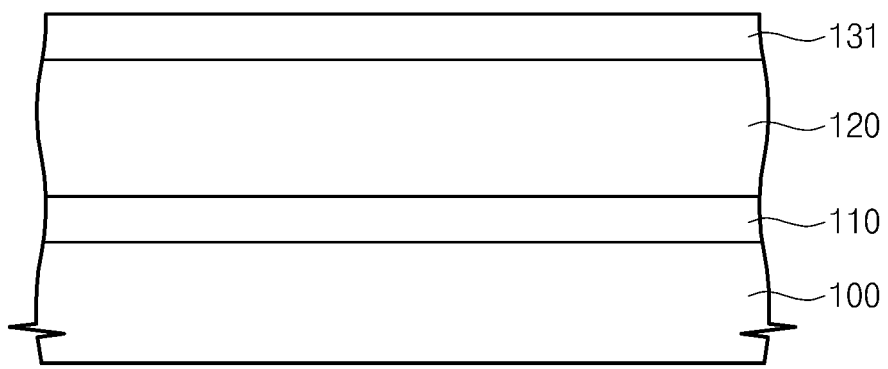

Referring to FIG. 4, a first electrode 110, an organic layer 120, and a lower conductive layer 131 can be sequentially stacked on a substrate 100.

In some embodiments, the substrate 100 can be formed of a transparent material. For example, the substrate 100 can be one of a glass substrate, a transparent plastic substrate, and a transparent flexible substrate.

The first electrode 110 can be formed by coating or depositing a transparent conductive material on the substrate 100. In some embodiments, the transparent conductive material can be one of a transparent conductive oxide, a transparent conductive organic material, and a conductive nano tube.

The organic layer 120 can be formed by coating or depositing a low or high molecular organic material on the first electrode 110. The organic layer 120 can include at least one light-emitting layer EML. In some embodiments, the organic layer 120 can have a multi-layered structure.

The lower conductive layer 131 can be formed by depositing a conductive material on the organic layer 120. For example, the formation of the lower conductive layer 131 can include depositing a layer including at least one of Mo, MoW, Cr, AlNd and Al alloys on the organic layer 120.

In some embodiments, before the formation of the first electrode 110, a buffer layer (not shown) can be formed on the substrate 100. The buffer layer can be one of silicon oxide and silicon nitride. Alternatively, the buffer layer can be a multi-layered structure including a silicon oxide layer and a silicon nitride layer. Due to the presence of the buffer layer, it is possible to prevent impurity ions from being diffused, to prohibit infiltration of moisture and/or oxygen, and to make a top surface of the substrate 100 flat.

Figure 5:
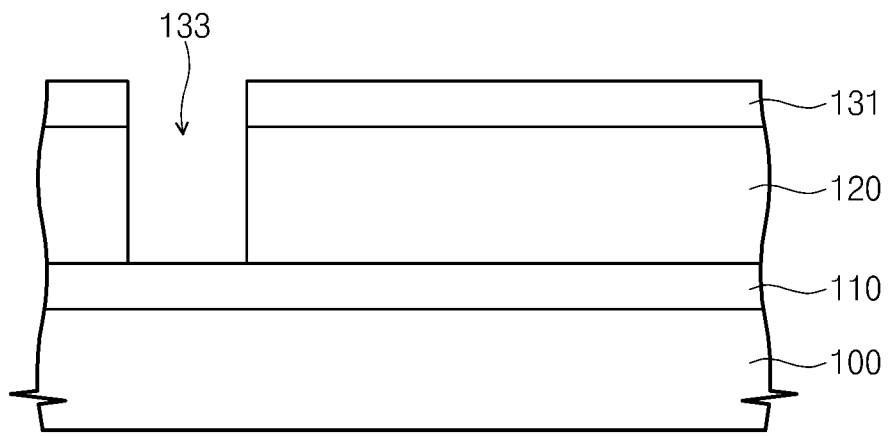

Referring to FIG. 5, in order to verify whether a light is effectively generated from the organic layer 120, a voltage difference can be applied between the first electrode 110 and the lower conductive layer 131, after the formation of the lower conductive layer 131.

If a light is not generated from the organic layer 120, there can be an electric short between the first electrode 110 and the lower conductive layer 131. Although this electric short can result from various causes, in most cases, it results from an extraneous matter, which can be inflowed in the organic layer 120 during a fabricating process.

If a light is not generated from the organic layer 120, an analysis step can be performed to verify a position of the electric short, which can correspond to a position of an extraneous matter in the organic layer.

After the analysis step, the extraneous matter can be removed from the organic layer. For example, the removal process can be performed using a laser incident through a surface (hereinafter, "upper surface") of the lower conductive layer 131 opposite the substrate 100.

As the result of the removal process using the laser, a portion of the organic layer 120 corresponding to the position of the removed extraneous matter can be removed to form a hole 133. The hole 133 can be formed to penetrate the lower conductive layer 131 at the verified position(s) of the electric short. In some embodiments, a depth of the hole 133 can be smaller than a total thickness of the organic layer 120 and the lower conductive layer 131. In other embodiments, the hole 133 can be formed to penetrate both the lower conductive layer 131 and the organic layer 120 at the verified position(s) of the electric short, and in this case, a portion of the first electrode 110 can be exposed by the hole 133.

Figure 6:
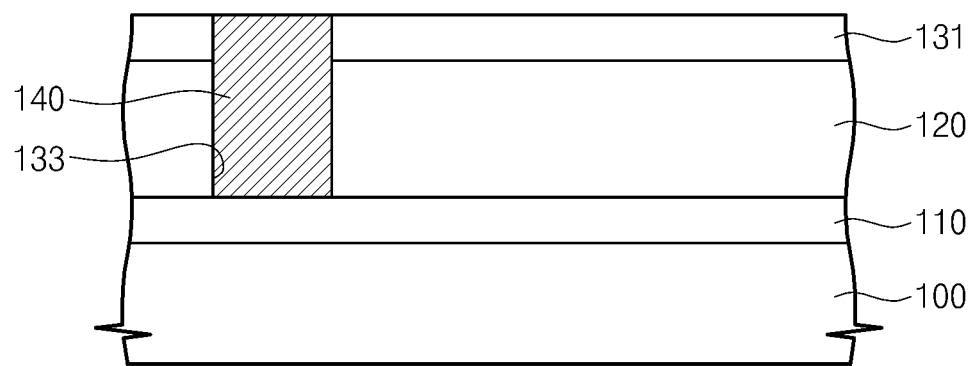

Referring to FIG. 6, after the formation of the hole 133, an insulating material, such as silicon oxide, silicon nitride, and an organic insulating material, can be deposited. The insulating material can form an insulating pattern 140 filling the hole 133. In some embodiments, a height of the insulating pattern 140 can be substantially equivalent to a depth of the hole 133.

Figure 7:
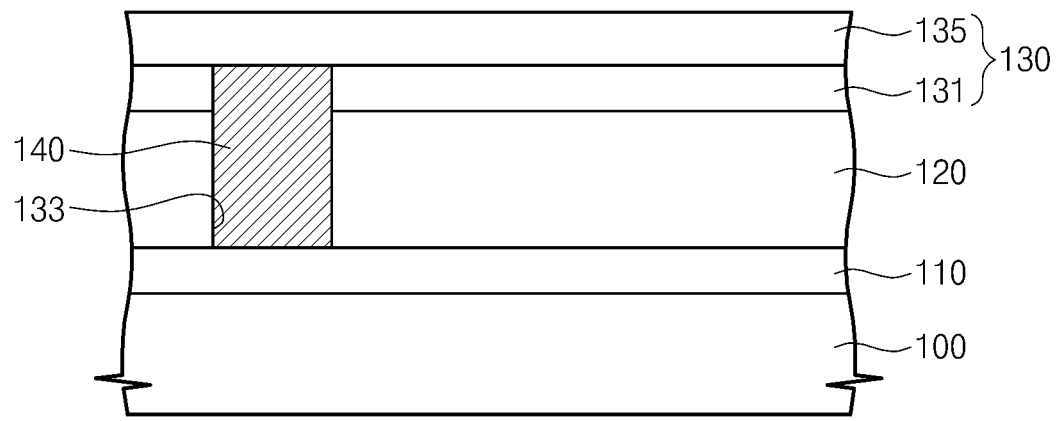

Referring to FIG. 7, an upper conductive layer 135 can be formed on the upper surface of the lower conductive layer 131 to cover at least the insulating pattern 140. The lower conductive layer 131 and the upper conductive layer 135 can form a second electrode 130. In some embodiments, the upper conductive layer 135 can be formed to cover wholly the upper surfaces of the lower conductive layer 131 and the insulating pattern 140.

In some embodiments, a plurality of insulating layers (not shown) can be deposited on the second electrode 130 to separate its underlying structure (i.e., the organic electroluminescent device) from an external environment. In the case in which the organic electroluminescent display device is a bottom emitting type, a metal sheet (not shown) can be provided on the plurality of insulating layer to reflect a portion of a light generated from the organic layer 120 toward the substrate 100.

The afore-described organic electroluminescent display device and the method of fabricating the same according to certain embodiments, an extraneous matter included in an organic layer can be removed, and thus, a failure pixel can be used as a good pixel. This enables to improve a yield of the organic electroluminescent display device.

While certain embodiments of the inventive concepts have been particularly shown and described, it will be understood by one of ordinary skill in the art that variations in form and detail can be made therein without departing from the spirit and scope of the attached claims.

What is claimed is:

1. An organic electroluminescent display device, comprising:
    a substrate;
    a first electrode on the substrate;
    an organic layer including a light-emitting layer on the first electrode;
    a second electrode including lower and upper conductive layers sequentially stacked on the organic layer;
    a hole penetrating the lower conductive layer and at least a portion of the organic layer, the hole not penetrating the upper conductive layer; and
    an insulating pattern provided in the hole.

2. The device of claim 1, wherein a height of the insulating pattern is smaller than or equivalent to a total thickness of the organic layer and the lower conductive layer.

3. The device of claim 1, wherein the insulating pattern comprises at least one of a silicon oxide layer or a silicon nitride layer.

4. The device of claim 1, wherein the first electrode comprises a layer of transparent conductive oxide, and the second electrode comprises a metal layer whose work function is lower than that of the first electrode.

5. The device of claim 1, wherein a thickness of the upper conductive layer is greater than that of the lower conductive layer.

6. A method of fabricating an organic electroluminescent display device, comprising:
    forming a first electrode on a substrate;
    forming an organic layer including a light-emitting layer on the first electrode;
    forming a lower conductive layer on the organic layer;
    illuminating a laser onto the organic layer through an upper surface of the lower conductive layer to remove an extraneous matter from the organic layer and form a hole penetrating the lower conductive layer;
    forming an insulating pattern to fill the hole; and
    forming an upper conductive layer to cover the insulating pattern and the lower conductive layer, wherein the hole does not penetrate the upper conductive layer.

7. The method of claim 6, further comprising analyzing a position of an electric short between the first electrode and the lower conductive layer.

8. The method of claim 7, wherein the illuminating of the laser is performed in such a way that the laser is irradiated onto a region corresponding to the position of the electric short.

9. The method of claim 6, wherein a depth of the hole is smaller than or equal to a total thickness of the organic layer and the lower conductive layer.

10. The method of claim 9, wherein a depth of the hole is substantially equal to a height of the insulating pattern.

11. The method of claim 6, wherein the insulating pattern is formed by depositing at least one of silicon oxide or silicon nitride.

12. The method of claim 6, wherein a thickness of the upper conductive layer is greater than that of the lower conductive layer.

13. A method of fabricating an organic electroluminescent display device, comprising:
    forming a first electrode on a substrate;
    forming an organic layer including a light-emitting layer on the first electrode;
    forming a lower conductive layer on the organic layer;
    analyzing a position of an electric short between the first electrode and the lower conductive layer;
    illuminating a laser onto the organic layer through an upper surface of the lower conductive layer to remove an extraneous matter from the organic layer and form the hole penetrating the lower conductive layer, wherein the illuminating of the laser is performed in such a way that the laser is irradiated onto a region corresponding to the position of the electric short;
    forming an insulating pattern to fill the hole; and
    forming an upper conductive layer to cover the insulating patter and the lower conductive layer.

* * * * *